United States Patent
Liao et al.

(10) Patent No.: US 7,846,804 B2
(45) Date of Patent: Dec. 7, 2010

(54) METHOD FOR FABRICATING HIGH TENSILE STRESS FILM

(75) Inventors: Hsiu-Lien Liao, Tai-Chung (TW);
Neng-Kuo Chen, Hsin-Chu (TW);
Teng-Chun Tsai, Hsin-Chu (TW);
Yi-Wei Chen, Tai-Chung Hsien (TW)

(73) Assignee: United Microelectronics Corp., Science-Based Industrial Park, Hsin-Chu (TW)

(*) Notice: Subject to any disclaimer, the term of this patent is extended or adjusted under 35 U.S.C. 154(b) by 529 days.

(21) Appl. No.: 11/758,623

(22) Filed: Jun. 5, 2007

(65) Prior Publication Data
US 2008/0305600 A1    Dec. 11, 2008

(51) Int. Cl.
*H01L 21/336* (2006.01)
(52) U.S. Cl. ............... 438/308; 438/199; 438/200; 438/535; 438/664; 438/795
(58) Field of Classification Search ........... 438/199, 438/200, 201, 216, 308, 535, 663, 664, 795, 438/949, FOR. 117, FOR. 136, FOR. 137
See application file for complete search history.

(56) References Cited

U.S. PATENT DOCUMENTS

| 5,863,327 | A   | 1/1999  | Thakur |
|-----------|-----|---------|--------|
| 2004/0253791 | A1  | 12/2004 | Sun |
| 2005/0158996 | A1* | 7/2005  | Kim et al. ............ 438/664 |
| 2006/0249795 | A1* | 11/2006 | Chen et al. ........... 257/371 |
| 2007/0105292 | A1  | 5/2007  | Chen |
| 2008/0206943 | A1* | 8/2008  | Chen et al. ........... 438/229 |

* cited by examiner

*Primary Examiner*—N Drew Richards
*Assistant Examiner*—Joannie A Garcia
(74) *Attorney, Agent, or Firm*—Winston Hsu; Scott Margo

(57) ABSTRACT

A method and an apparatus for fabricating a high tensile stress film includes providing a substrate, forming a poly stressor on the substrate, and performing an ultra violet rapid thermal process (UVRTP) for curing the poly stressor and adjusting its tensile stress status, thus the poly stressor serves as a high tensile stress film. Due to a combination of energy from photons and heat, the tensile stress status of the high tensile stress film is adjusted in a relatively shorter process period or under a relatively lower temperature.

29 Claims, 10 Drawing Sheets

METHOD FOR FABRICATING HIGH TENSILE STRESS FILM

BACKGROUND OF THE INVENTION

1. Field of the Invention

The present invention relates to a method for fabricating a high tensile stress film, and more particularly, to a method for fabricating a high tensile stress film on a strained-silicon Metal-Oxide-Semiconductor (MOS) transistor.

2. Description of the Prior Art

As semiconductor processes advance to very deep sub-micron geometries, such as 65-nm node and beyond, and with the progress of device miniaturization, enhancing carrier mobility and a driving current of a Metal-Oxide-Semiconductor (MOS) transistor has become a critical issue. In order to improve a speed of the MOS transistors, a strained-silicon technique has been developed and is taken as a main solution to improve performance of the MOS transistor. This technique improves scaling limits and device performance by introducing strain into the channel region, which can improve electron and hole mobility.

In one approach of the strained-silicon technique, a high stress film, such as a poly stressor or a contact etch stop layer (CESL), is formed over the MOS transistors to provide stress; in another approach, devices are fabricated directly on a strained-silicon wafer incorporating selective epitaxial growth (SEG). The former described approach is additionally divided into two branches according to different electrical demands for PMOS and NMOS: a high tensile stress film providing a uniaxial tensile stress on a source/drain and a channel region of an NMOS improves electron mobility, whereas a high compressive stress film providing a uniaxial compressive stress on a source/drain and a channel region of a PMOS improves hole mobility.

Please refer to FIG. 1, which is a schematic drawing illustrating a conventional method for fabricating a high tensile stress film. As shown in FIG. 1, a semiconductor substrate 10 comprises at least an NMOS transistor 12, which includes a gate structure. The gate structure comprises a gate oxide 14 and a gate 16 formed on the gate oxide 14. A cap layer 18 is formed on top of the gate 16 and an ONO offset spacer 20 is formed on sidewalls of the gate structure. In addition, the NMOS transistor 12 further comprises source/drain regions 22. Shallow trench isolations (STIs) 24 around the NMOS transistor 12 are formed in the semiconductor substrate 10. Please refer to FIG. 1 again. A high tensile stress film 26 composed of silicon nitride or silicon oxide is formed on a surface of the NMOS transistor 12 by a plasma-enhanced chemical vapor deposition (PECVD) method.

Generally speaking, the tensile-stress status of the high tensile stress film 26 has to be greater than 1.5 GPa, and it is required to be greater than 1.8 GPa in a next-generation 45 nm process. However, so far 1.5 GPa is an upper performance limit for the high tensile stress film formed by the conventional PECVD method. Therefore, the prior art provides a rapid thermal processing (RTP) method, which applies a high temperature, such as 1000° C., to the high tensile stress film 26 to adjust its tensile stress status. However, the RTP method is limited when applied to a CESL, which is formed on a substrate having a silicide layer over gate and source/drain regions, because the silicide layer may be destroyed at such a high temperature. To avoid this problem, the temperature of the RTP method is reduced, but accordingly the target value of the tensile-stress status is reduced.

Furthermore, the prior art also provides an ultra violet (UV) curing method to adjust the tensile stress status of the high tensile stress film 26 by exposing the high tensile stress film 26 to a UV light. The UV curing method utilizes photons to break the Si—H and SiN—H bonds of the high tensile stress film 26 and removes hydrogen from the high tensile stress film 26. Thus, an irreversible tensile stress is generated in the high tensile stress film 26. In other words, the more hydrogen is removed, the higher the tensile stress status of the high tensile stress film 26 is obtained. However, the UV curing method requires a longer process period and is limited by a thickness of the high tensile stress film 26.

SUMMARY OF THE INVENTION

Therefore the present invention provides a method and an apparatus for fabricating a high tensile stress film on a strained-silicon MOS transistor.

According to the claimed invention, a method for fabricating a poly stressor is provided. The method comprises providing a substrate having at least a transistor formed thereon, forming a poly stressor on the substrate, and performing an ultra violet rapid thermal process (UVRTP) for curing the poly stressor and adjusting a tensile stress of the poly stressor.

According to the claimed invention, another method for fabricating a contact etch stop layer (CESL) is provided. The method comprises providing a substrate having at least a gate, a spacer, and a source/drain region, forming a metal layer on the substrate, performing a rapid thermal annealing (RTA) process to form intergraded salicide layers on the gate and the source/drain regions respectively, forming a CESL on the substrate, and performing a UVRTP for curing the CESL and adjusting a tensile stress of the CESL.

According to the claimed invention, still another method for fabricating high tensile stress films is provided. The method comprises providing a substrate having at least a gate, a spacer and a source/drain region formed thereon. Then forming a first high tensile stress film on the substrate and performing a first ultra violet rapid thermal process (UVRTP) for simultaneously curing the first high tensile stress film and adjusting a tensile stress of the first high tensile stress film. Next, the first high tensile stress film is removed and a metal layer is formed on the substrate. Then, performing a rapid thermal annealing (RTA) process to form intergraded salicide layers on the gate and the source/drain region respectively, forming a second high tensile stress film on the substrate, and performing a second UVRTP for curing the second high tensile stress film and adjusting a tensile stress of the second high tensile stress film.

The present invention herein also provides an ultra violet rapid thermal process apparatus comprising a chamber for accommodating a wafer, a holder positioned in the chamber for holding the wafer, and an ultra violet light source and heating device comprising an UV light source and a heating source.

The methods for fabricating the high tensile stress film, the poly stressor, and the CESL utilize the UVRTP to cure the high tensile stress film, the poly stressor, and the CESL and simultaneously adjust the respective tensile-stress status of each. Because the tensile-stress status is adjusted by energy from a combination of photons and heat, the high tensile stress film can be cured and adjusted in a relatively shorter process period or at lower temperature than the temperature of the conventional method. Additionally, since the UVRTP can replace a second RTA process in the conventional salicide process, the method for fabricating high tensile stress film can further simplify the whole processes for fabricating salicide and CESL.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
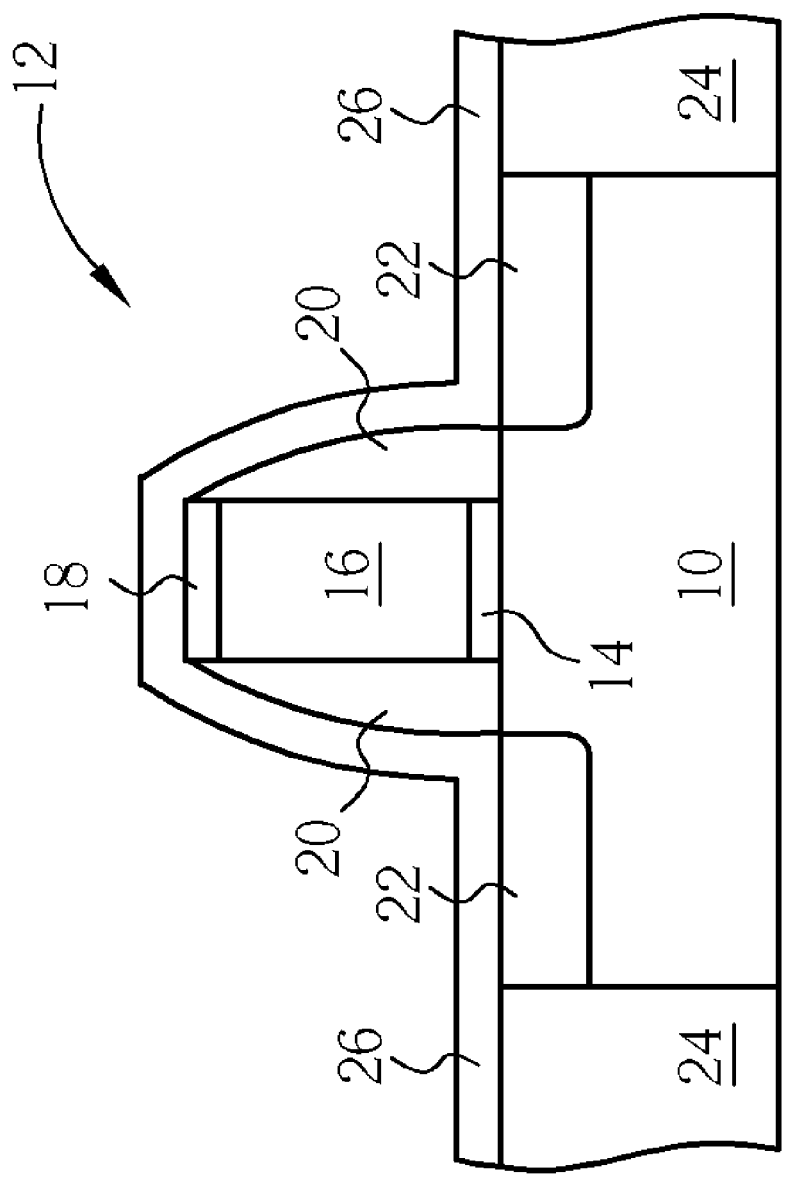
FIG. 1 is a schematic drawing illustrating a conventional method for fabricating a high tensile stress film.
Figure 2:
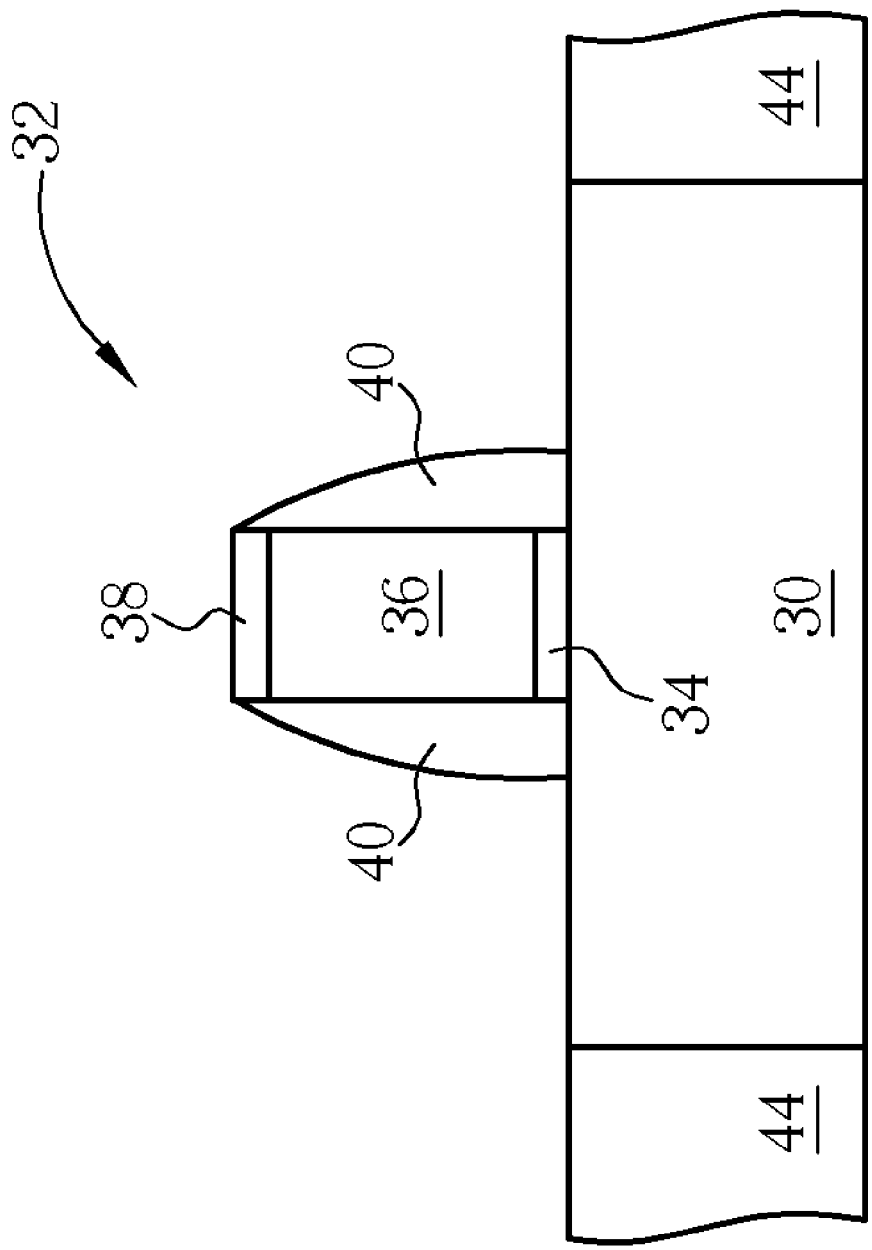
FIGS. 2-4 are schematic drawings illustrating the method for fabricating a high tensile stress film taught by the present invention.
Figure 3:
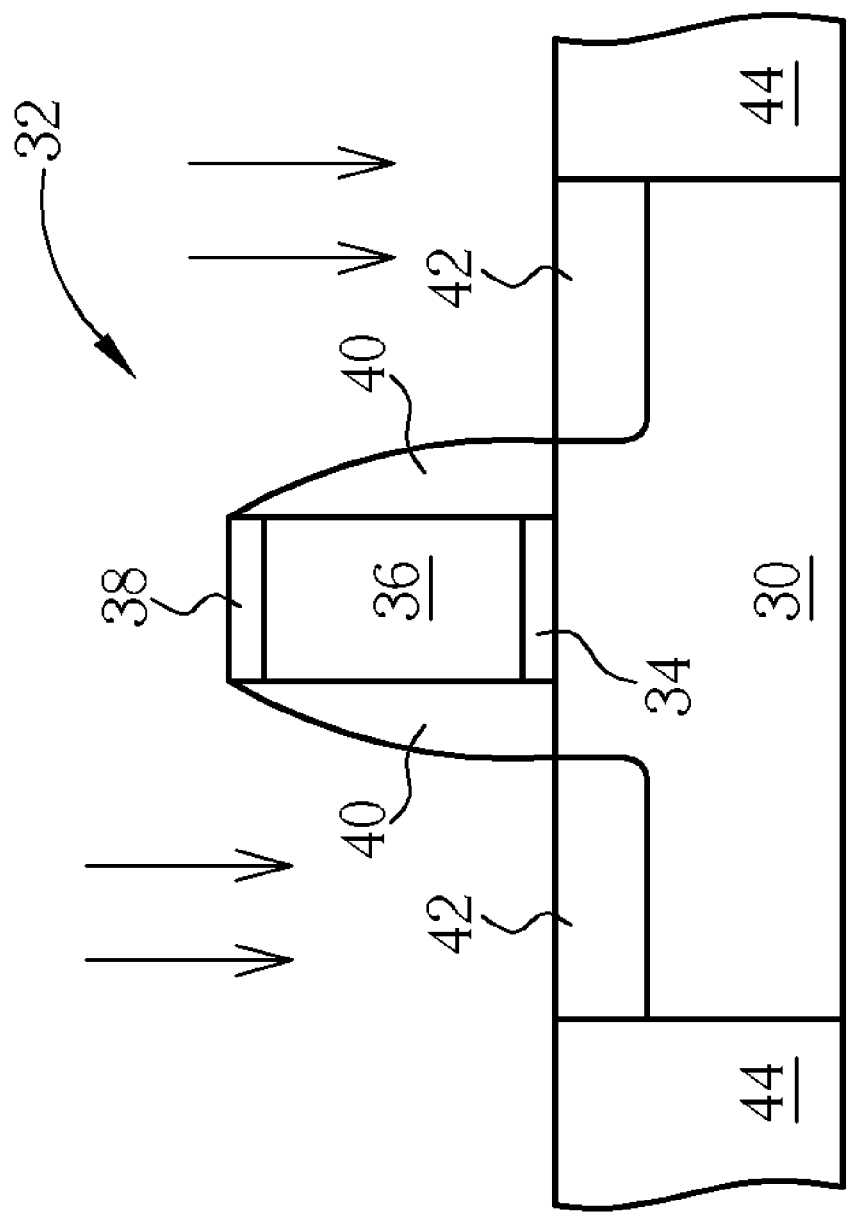
Figure 4:
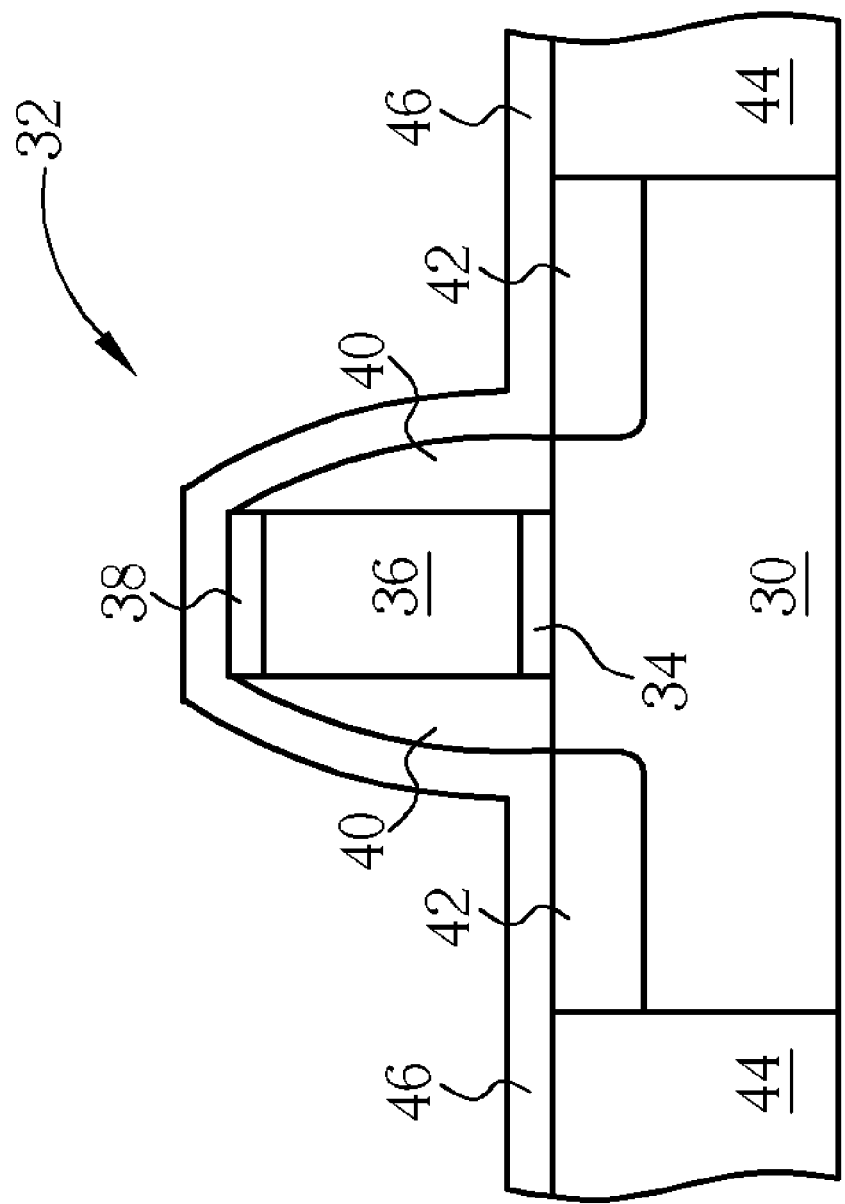

Please refer to FIGS. 2-4, which are schematic drawings illustrating the method for fabricating high tensile stress film according to a first preferred embodiment taught by the present invention. As shown in FIG. 2, a substrate 30 such as a silicon wafer or a silicon-on-insulator (SOI) substrate is provided first. The substrate 30 has at least a gate structure 32 of a transistor, such as an NMOS transistor, formed thereon, and the gate structure 32 comprises a gate dielectric 34 and a gate 36 formed on the gate dielectric 34. A cap layer 38 is formed on top of the gate 36 and an ONO offset spacer 40 is formed on sidewalls of the gate structure 32. The gate dielectric 34 composed of silicon oxide or silicon nitride is formed by a thermal oxidation or a deposition; and the cap layer 38 protecting the gate 36 is formed by silicon nitride. In addition, shallow trench isolations (STIs) 44 around the gate structure 32 are formed in the substrate 30 for electrically isolating the transistor from other devices.

Please refer to FIG. 3. Then, an ion implantation process is performed to form a drain/source region 42 in the substrate 30 surrounding the gate structure 32, and a rapid thermal annealing (RTA) process is performed which uses a temperature between 900° C. and 1050° C. to activate dopants within the source/drain region 42. At the same time, the RTA process repairs a damaged lattice structure of the semiconductor substrate 30 resulting from the ion implantation process. Additionally, depending on different product demands and fabrication processes, lightly doped drains (LDDs) or source/drain extensions can be formed between the source/drain region 42 and the gate structure 32. The above-mentioned processes are well known to those skilled in the art, therefore the details are omitted.

Please refer to FIG. 4. A deposition process such as a plasma-enhanced chemical vapor deposition (PECVD) process is performed to form a high tensile stress film, such as a poly stressor 46. The poly stressor 46 comprises silicon nitride, silicon oxide, or silicon oxynitride. A tensile-stress status of an as-deposition of the poly stressor 46 is lower than 1.5 GPa. Next, an ultra violet rapid thermal process (UVRTP) is performed to cure the poly stressor 46 and simultaneously adjust a tensile stress of the poly stressor 46. Since the poly stressor 46 accepts substantial heat energy in a relatively short time during the UVRTP, such a thermal shock makes the poly stressor 46 to obtain an accumulated stress. Therefore a tensile-stress status of the poly stressor 46 can be improved to 0.5-3.0 GPa. Preferably, the UVRTP increases the stress of the poly stressor 46, which expands the semiconductor substrate 30 underneath the gate structure 32, such as a lattice arrangement in the channel region, thereby increasing the electron mobility in the channel region and the driving current of the transistor.

According to the first preferred embodiment provided by the present invention, the UVRTP is performed at a temperature between 150-800° C. for a duration of 0-60 minutes with its UV light having a wavelength in a range of 100-400 nm. The UVRTP is performed under a pressure between 3-500 mTorr. Additionally, the UVRTP further comprises introducing a nitrogen gas or and an inert gas.

According to the first preferred embodiment, the poly stressor 46 is cured and its tensile stress status is adjusted simultaneously in the UVRTP. In other words, by energy from a combination of photons and heat, the poly stressor 46 can be cured and adjusted in a relatively shorter process period. Additionally, due to influence of the thermal shock, the tensile stress status of the poly stressor 46 is improved to 0.5-3.0 GPa, which satisfies requirement to the tensile stress in state-of-the-art.

Figure 5:
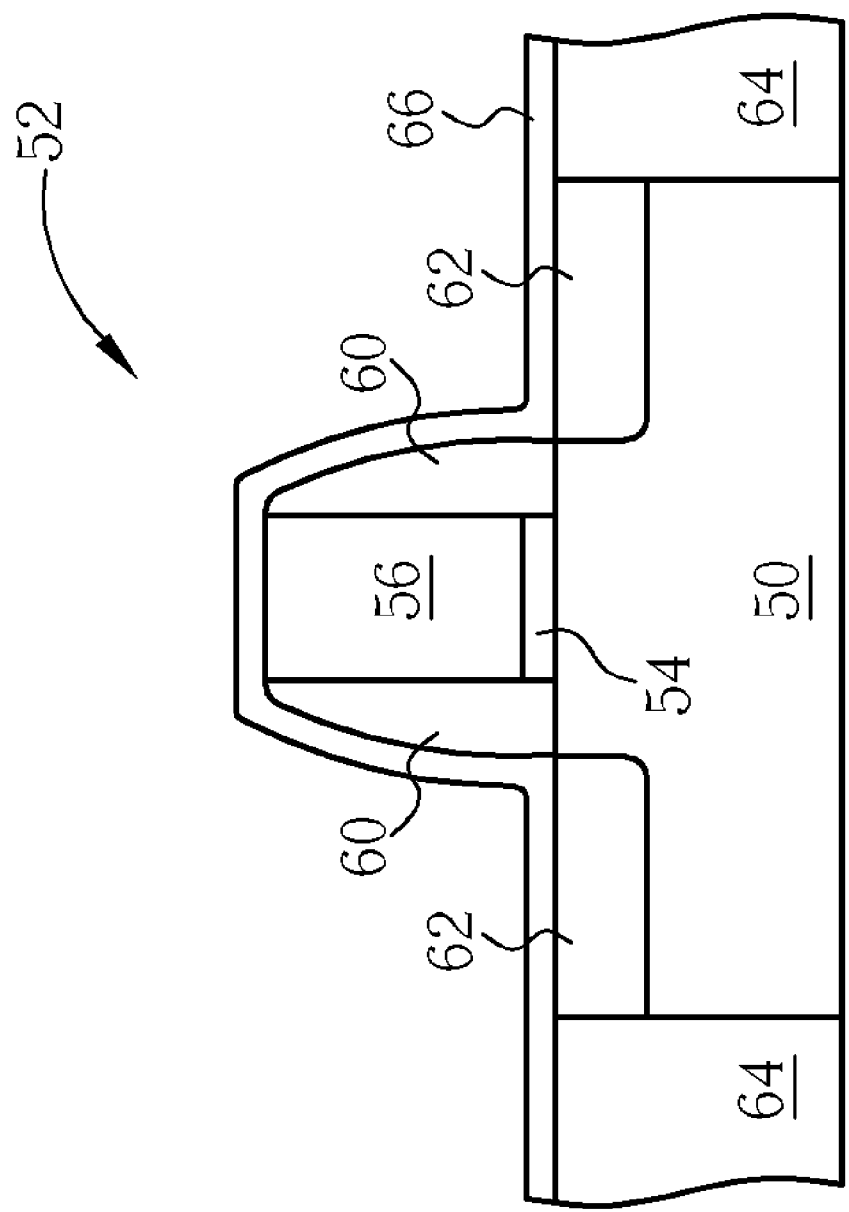
FIGS. 5-7 are schematic drawings illustrating the method for fabricating a contact etch stop layer (CESL) according to the present invention.
Figure 6:
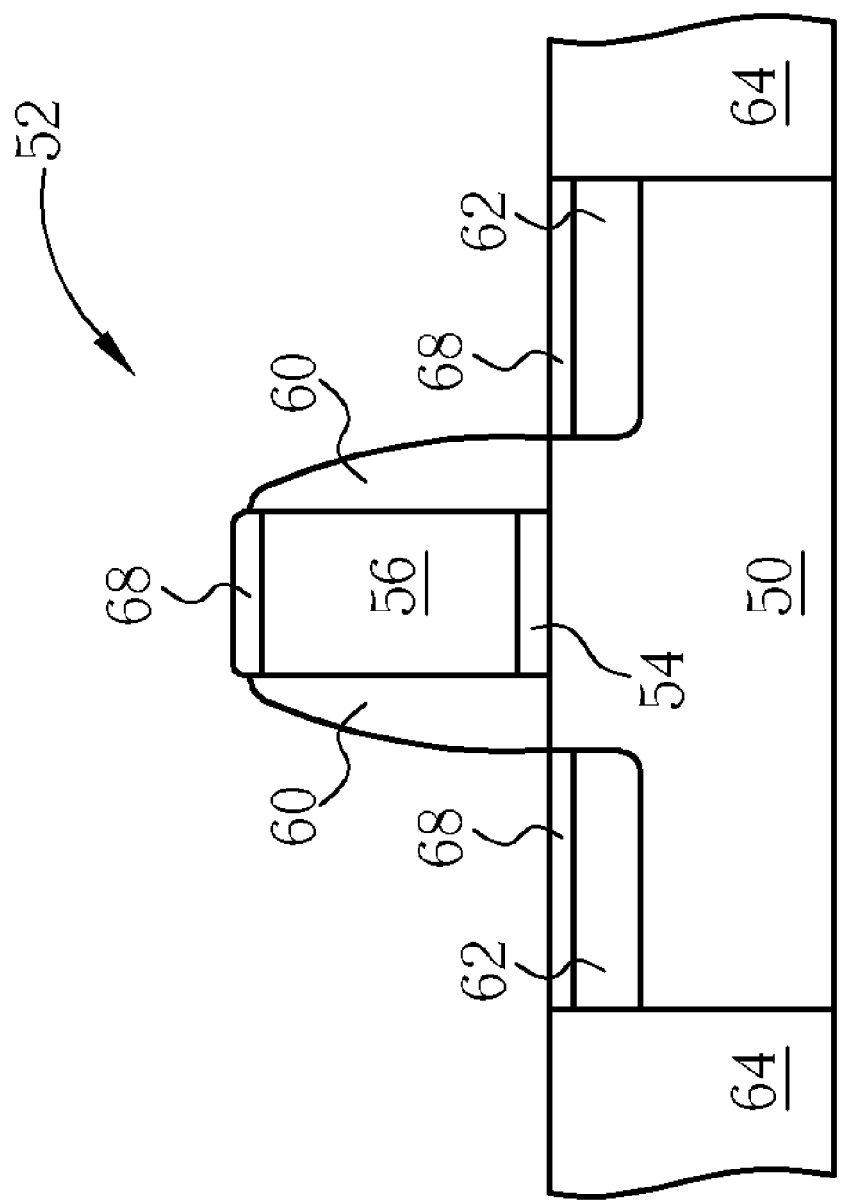
Figure 7:
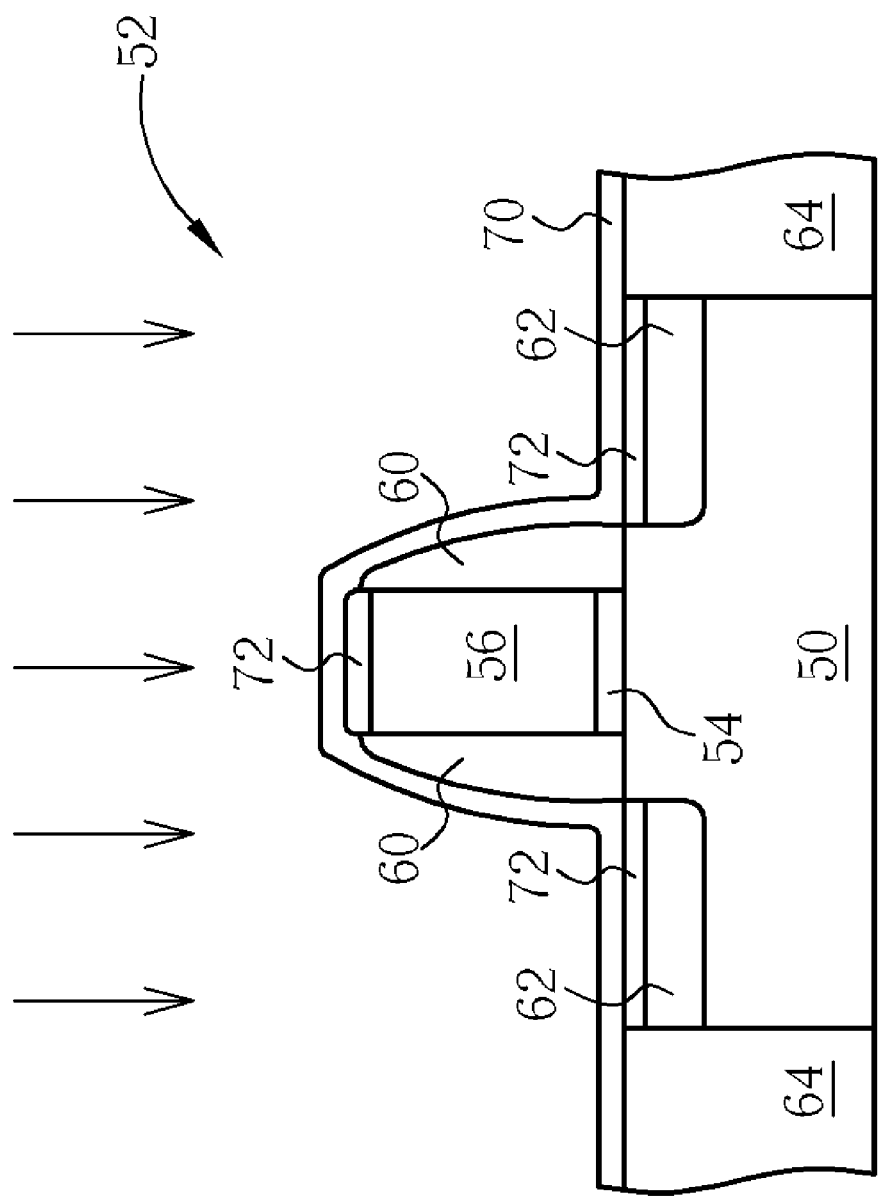

Please refer to FIGS. 5-7, which are schematic drawings illustrating the method for fabricating a contact etch stop layer (CESL) according to a second preferred embodiment taught by the present invention. As shown in FIG. 5, a substrate 50 having at least a gate structure 52 of a transistor, such as an NMOS transistor, is first provided. The gate structure 52 comprises a gate dielectric 54, a gate 56 formed on the gate dielectric 54, and an ONO offset spacer 60. In addition, shallow trench isolations (STIs) 64 around the gate structure 52 are formed in the substrate 50 for electrically isolating the transistor from other devices.

Please refer to FIG. 5 again. Then, an ion implantation process is performed to form a drain/source region 62 in the substrate 50 surrounding the gate structure 52 and an RTA process is performed at a temperature between 900° C. to 1050° C. to activate dopants within the source/drain region 52. Additionally, depending on different product demands and fabrication processes, lightly doped drains (LDDs) or source/drain extensions can be formed between the source/drain region 62 and the gate structure 52. The above-mentioned processes are well known to those skilled in the art, therefore the details are omitted.

Please refer to FIGS. 5-6. Next, a metal layer 66 is formed on the substrate 50. The metal layer 66 preferably comprises Co, Ti, Ni, W, Pt, Pd, Mo, or alloys of the aforementioned metals. An RTA process is performed at a temperature between 400-600° C. to form intergraded salicide layers 68 on the source/drain region 62 and the gate 56, respectively. And, a selective wet cleaning process is performed to remove the unreacted metal layer 66.

Please refer to FIG. 7. A deposition process, such as PECVD, is performed to form a CESL 70, which comprises silicon nitride, silicon oxide, or silicon oxynitride. A tensile-stress status of an as-deposition of the CESL 70 is lower than 1.5 GPa. Then, a UVRTP is performed to cure the CESL 70 and adjust a tensile-stress status of the CESL 70. Preferably, the UVRTP increases the stress of the CESL 70 which thereby expanding the semiconductor substrate 50 underneath the gate structure 52, such as the lattice arrangement in the channel region, thereby increasing the electron mobility in the channel region and the driving current of the transistor.

Please refer to FIG. 7 again. It is noteworthy that a salicide layer requires two RTA processes in the conventional method.

The first RTA process is used to form an intergraded salicide layer with smaller grains but higher resistance; the second RTA process is used to transform the intergraded salicide layer and reduce its resistance. However, according to the present invention, the UVRTP is used to cure the CESL, to adjust its tensile stress, and to transform the intergraded salicide layers 68 into salicide layers 72 at the same time. Therefore the second RTA process in the conventional method for fabricating salicide can be deleted. In other words, the UVRTP provided by the present invention can replace the second RTA process in the conventional method for fabricating salicide layer. In addition, transformation of the salicide layer 72 also causes a tensile stress toward the substrate 50. Therefore the overall tensile stress status of the salicide layer 72 and the CESL 70 can reach 0.5-3.0 GPa.

According to the second preferred embodiment provided by the present invention, the UVRTP is performed at a temperature between 150-800° C. for a duration of 0-60 minutes with its UV light having a wavelength in a range of 100-400 nm. The UVRTP is performed under a pressure between 3-500 mTorr. Additionally, the UVRTP further comprises introducing a nitrogen gas or and an inert gas. Please note that the UVRTP and the RTA process can be performed in-situ or ex-situ.

According to the second preferred embodiment, the CESL 70 is cured and its tensile stress status is adjusted simultaneously in the UVRTP. In other words, by energy from a combination of photons and heat, the CESL 70 can be cured and adjusted in a relatively shorter process period or at a relatively lower temperature. Additionally, the UVRTP can further replace the second RTA process needed in the conventional method for fabricating salicide layer, therefore the method provided by the present invention not only simplifies the whole process of the salicide layer and the CESL, but also improves the tensile stress status to 0.5-3.0 GPa, which satisfies requirement to the tensile stress in state-of-the-art.

In the first preferred embodiment, the poly stressor, which serves as a first high tensile stress film, provides an irreversible tensile stress to the substrate under the transistor, namely the channel region, by performing a first UVRTP. Therefore the first high tensile stress film can be removed and the steps described in the second preferred embodiment can be performed. As mentioned above, after removing the first high tensile stress film and forming the intergraded salicide layers, a second high tensile stress film is formed on the substrate. Then, a second UVRTP is performed to cure the second high tensile stress film and adjust a tensile stress of the second high tensile stress film. Simultaneously, the intergraded salicide layer is transformed into salicide layer in the second UVRTP and provides another tensile stress to the substrate. Additionally, the second high tensile stress film serves as a contact etch stop layer (CESL). In summary, by connecting methods provided by the first and second preferred embodiments, lattice arrangement in the channel region can be expanded twice to three times which further satisfies requirement to the tensile stress in state-of-the-art.

Figure 8:
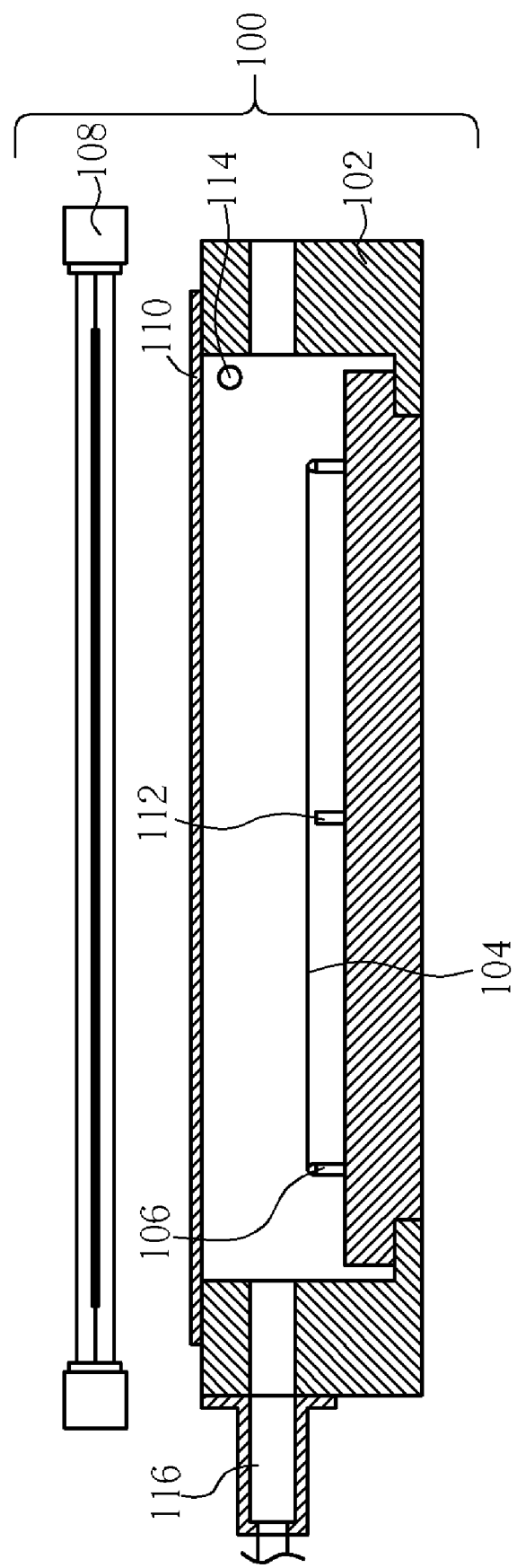
FIG. 8 is a schematic drawing of an ultra violet rapid thermal process (UVRTP) apparatus taught by the present invention.

Please refer to FIG. 8, which is a schematic drawing of an ultra violet rapid thermal process (UVRTP) apparatus provided by the present invention. As shown in FIG. 8, the UVRTP apparatus 100 comprises a chamber 102 for accommodating a wafer 104, a holder 106 further comprising a heating function positioned in the chamber 102 for holding the wafer 104, and an ultra violet light source and heating device 108. The UVRTP apparatus 100 further comprises a shutter element 110 for controlling passage of an ultra violet light and a temperature sensor 112 for sensing a temperature of the wafer 104. Furthermore, the UVRTP apparatus 100 comprises a gas inlet 114 and a gas outlet 116 for introducing and exhausting nitrogen, inert gas, or reaction gas according to different processes for different wafers.

Figure 9:
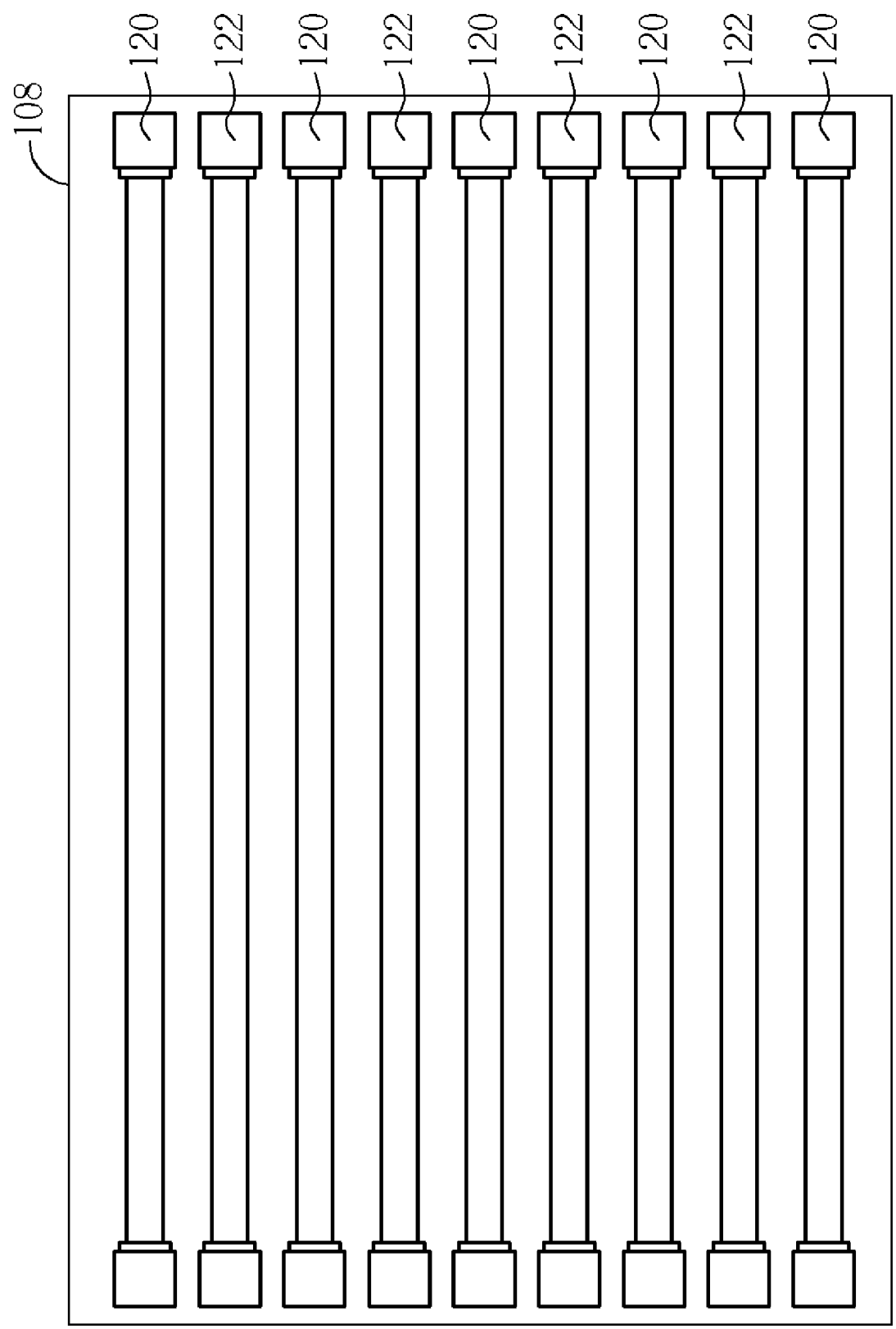
FIGS. 9-10 are schematic drawings respectively illustrating an ultra violet light source and heating device provided by the present invention.
Figure 10:
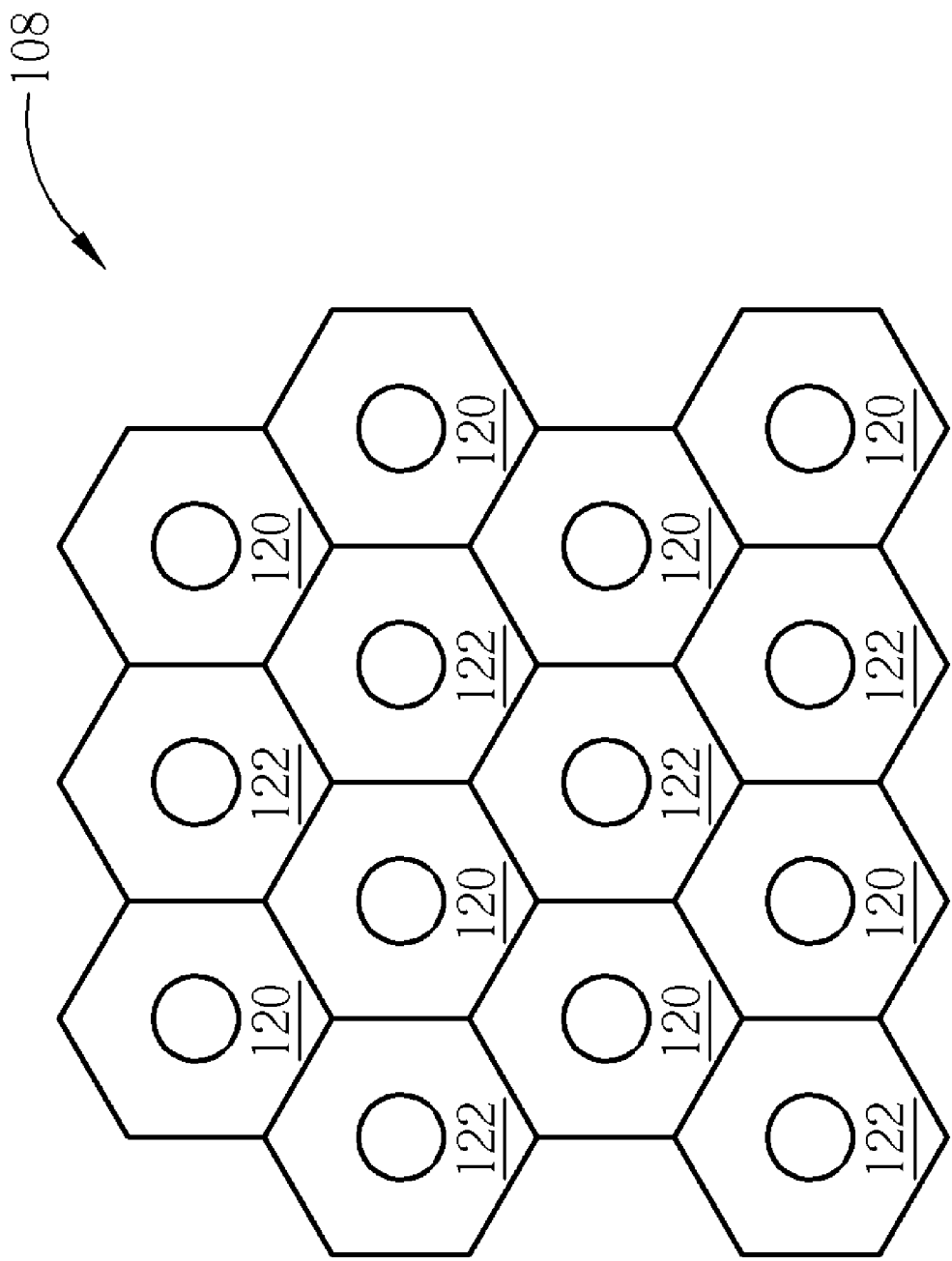

Please refer to FIGS. 9-10, which are schematic drawings respectively illustrating an ultra violet light source and heating device 108 provided by the present invention. The ultra violet light source and heating device 108 includes at least a heating source 120 and an UV light source 122. The heating source 120 can be a halogen lamp or a laser source. The UV light source 122 provides an UV light having a wavelength between 100-400 nm. Arrangement of the heating source 120 and an UV light source 122 can be interlaced as shown in FIG. 9, or be honeycomb-like as shown in FIG. 10. Needless to say, arrangement of the heating source 120 and an UV light source 122 is not limited by FIGS. 9-10, for example, the heating source 120 and an UV light source 122 also can be interlaced in matrix.

According to the UVRTP apparatus provided by the present invention, an UV light treatment or a rapid thermal process can be performed individually. More important, the UV light treatment also can be performed simultaneously with the rapid thermal process, which means energy from a combination of photons and heat can be obtained in the UVRTP apparatus provided by the present invention. Therefore a process needs both the UV light treatment and the rapid thermal process is preferably performed in the UVRTP apparatus provided by the present invention.

The methods for fabricating a high tensile stress film, a poly stressor, and a CESL utilize a UVRTP to cure and adjust the high tensile stress film, the poly stressor, and the CESL. Because tensile-stress status is adjusted by energy from a combination of photons and heat, the high tensile stress film can be cured and adjusted at a relatively lower temperature than a temperature of the conventional method and in a shorter process period. Therefore the method for fabricating high tensile stress film is much preferred for fabricating the CESL. More importantly, the UVRTP provided by the present invention replaces the second RTA process in the conventional method for fabricating salicide layer, thus the whole process is simplified. Furthermore, the UVRTP apparatus provided by the present invention satisfies the demands as mentioned above because the UVRTP apparatus provides UV light and heat energy simultaneously. The UVRTP apparatus also can be used in semiconductor processes needing UV light treatment, rapid thermal process, or both of the two treatments.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a contact etch stop layer (CESL), the method comprising:
    providing a substrate having at least a gate, a spacer and a source/drain region formed thereon;
    forming a metal layer on the substrate;
    performing a rapid thermal annealing (RTA) process to form intergraded salicide layers on the gate and the source/drain region respectively;
    forming a CESL on the substrate; and
    performing an ultra violet rapid thermal process (UVRTP) for curing the CESL, adjusting a tensile stress of the CESL, and transforming the intergraded salicide layers into salicide layers.

2. The method of claim 1, wherein the metal layer comprises a metal or an alloy of a metal from a set of metals comprising Co, Ti, Ni, W, Pt, Pd, and Mo.

3. The method of claim 1, wherein the RTA process is performed at a temperature between 400-600° C.

4. The method of claim 1, wherein the CESL comprises silicon nitride, silicon oxide, or silicon oxynitride.

5. The method of claim 1, wherein a tensile-stress status of an as-deposition of the CESL is lower than 1.5 GPa.

6. The method of claim 1, wherein the UVRTP is performed at a temperature between 150-800° C.

7. The method of claim 1, wherein the UVRTP is performed for a duration of 0-60 minutes.

8. The method of claim 1, wherein the UVRTP is performed under a pressure between 3-500 mTorr.

9. The method of claim 1, wherein an ultra violet light used in the UVRTP has a wavelength in a range of 100-400 nm.

10. The method of claim 1, wherein the UVRTP further comprises introducing a nitrogen gas.

11. The method of claim 1, wherein the UVRTP further comprises introducing an inert gas.

12. The method of claim 1, wherein a tensile-stress status of the CESL after performing the UVRTP is between 0.5-3.0 GPa.

13. The method of claim 1, wherein the RTA process and the UVRTP are performed in-situ or ex-situ.

14. A method for fabricating a high tensile stress film, the method comprising:
   providing a substrate having at least a gate, a spacer and a source/drain region formed thereon;
   forming a first high tensile stress film on the substrate;
   performing a first ultra violet rapid thermal process (UVRTP) for simultaneously curing the first high tensile stress film and adjusting a tensile stress of the first high tensile stress film;
   removing the first high tensile stress film after performing the first UVRTP;
   forming a metal layer on the substrate after removing the first high tensile stress film;
   performing a rapid thermal annealing (RTA) process to form intergraded salicide layers on the gate and the source/drain region respectively;
   forming a second high tensile stress film on the substrate; and
   performing a second UVRTP for curing the second high tensile stress film and adjusting a tensile stress of the second high tensile stress film.

15. The method of claim 14, wherein the first high tensile stress film and the second high tensile stress film comprise silicon nitride, silicon oxide, or silicon oxynitride.

16. The method of claim 14, wherein tensile-stress statuses of an as-deposition of the first high tensile stress film and the second high tensile stress film are lower than 1.5 GPa.

17. The method of claim 14, wherein the first UVRTP and the second UVRTP are performed at a temperature between 150-800° C.

18. The method of claim 14, wherein the first UVRTP and the second UVRTP are performed for a duration of 0-60 minutes.

19. The method of claim 14, wherein the first UVRTP and the second UVRTP are performed under a pressure between 3-500 mTorr.

20. The method of claim 14, wherein an ultra violet light used in the first UVRTP and the second UVRTP has a wavelength in a range of 100-400 nm.

21. The method of claim 14, wherein the first UVRTP and the second UVRTP further comprise a step of introducing a nitrogen gas or an inert gas.

22. The method of claim 14, wherein a tensile-stress status of the first high tensile stress film after performing the first UVRTP is between 0.5-3.0 GPa.

23. The method of claim 14, wherein the metal layer comprises a metal or an alloy of a metal from a set of metals comprising Co, Ti, Ni, W, Pt, Pd, and Mo.

24. The method of claim 14, wherein the RTA process is performed at a temperature between 400-600° C.

25. The method of claim 14, wherein a tensile-stress status of the second high tensile stress film after performing the second UVRTP is between 0.5-3.0 GPa.

26. The method of claim 14, wherein the second high tensile stress film serves as a contact etch stop layer (CESL).

27. The method of claim 14, wherein the first UVRTP, the second UVRTP, and the RTA process are performed in-situ or ex-situ.

28. The method of claim 14, wherein the second UVRTP is used to transform the intergraded salicide layers into salicide layers.

29. The method of claim 14, wherein the gate serves as a gate of an N-channel Metal-Oxide-Semiconductor (NMOS) transistor.

* * * * *